(12) United States Patent
Shiono et al.

(10) Patent No.: US 7,056,789 B2
(45) Date of Patent: Jun. 6, 2006

(54) PRODUCTION METHOD FOR SEMICONDUCTOR SUBSTRATE AND PRODUCTION METHOD FOR FIELD EFFECT TRANSISTOR AND SEMICONDUCTOR SUBSTRATE AND FIELD EFFECT TRANSISTOR

(75) Inventors: Ichiro Shiono, Toyko (JP); Kazuki Mizushima, Saitama (JP); Kenji Yamaguchi, Ikoma (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 85 days.

(21) Appl. No.: 10/487,526

(22) PCT Filed: Aug. 23, 2002

(86) PCT No.: PCT/JP02/08509

§ 371 (c)(1),
(2), (4) Date: Feb. 20, 2004

(87) PCT Pub. No.: WO03/019632

PCT Pub. Date: Mar. 6, 2003

(65) Prior Publication Data

US 2004/0245552 A1 Dec. 9, 2004

(30) Foreign Application Priority Data

Aug. 23, 2001 (JP) .............................. 2001-253175

(51) Int. Cl.
*H01L 21/336* (2006.01)

(52) U.S. Cl. ...................... 438/257; 438/263; 438/264; 438/494; 438/493; 438/586; 438/166; 438/149; 438/151; 438/118; 438/106; 438/478; 438/458; 438/507; 438/479; 257/347; 257/350

(58) Field of Classification Search ................ 438/257, 438/263, 264, 494, 493, 586, 166, 149, 151, 438/118, 106, 478, 458, 507, 479; 257/347, 257/350
See application file for complete search history.

(56) References Cited

U.S. PATENT DOCUMENTS

| 5,221,413 A | 6/1993 | Brasen et al. |
| 5,442,205 A | 8/1995 | Brasen et al. |
| 6,090,666 A | 7/2000 | Ueda et al. |
| 6,107,653 A | 8/2000 | Fitzgerald |
| 6,291,321 B1 | 9/2001 | Fitzgerald |

(Continued)

FOREIGN PATENT DOCUMENTS

EP  1 020 898 A2  7/2000

(Continued)

*Primary Examiner*—Christian D. Wilson
*Assistant Examiner*—Victor V. Yevsikov
(74) *Attorney, Agent, or Firm*—Pillsbury Winthrop Shaw Pittman LLP

(57) ABSTRACT

The present invention relates to a semiconductor substrate production method, field effect transistor production method, semiconductor substrate and field effect transistor which, together with having low penetrating dislocation density and low surface roughness, prevent worsening of surface and interface roughness during heat treatment of a device production process and so forth. A production method of a semiconductor substrate W, in which SiGe layers 2 and 3 are formed on an Si substrate 1, is comprised of a heat treatment step in which heat treatment is performed either during or after the formation of the SiGe layers by epitaxial growth, at a temperature that exceeds the temperature of the epitaxial growth, and a polishing step in which irregularities in the surface formed during the heat treatment are removed by polishing following formation of the SiGe layers.

7 Claims, 8 Drawing Sheets

U.S. PATENT DOCUMENTS

| | | |
|---|---|---|
| 6,506,669 B1 | 1/2003 | Kuramasu et al. |
| 6,524,935 B1* | 2/2003 | Canaperi et al. ............ 438/478 |
| 6,750,119 B1* | 6/2004 | Chu et al. ................... 438/479 |
| 2001/0003364 A1 | 6/2001 | Sugawara et al. |
| 2002/0168802 A1* | 11/2002 | Hsu et al. ................... 438/149 |
| 2004/0161911 A1* | 8/2004 | Chu et al. ................... 438/479 |

FOREIGN PATENT DOCUMENTS

| | | |
|---|---|---|
| JP | 6-252046 | 9/1944 |
| JP | 58-18928 | 2/1983 |
| JP | 11-340337 | 12/1999 |
| WO | WO 98/00857 | 1/1998 |
| WO | WO 00/01016 A1 | 1/2000 |

* cited by examiner

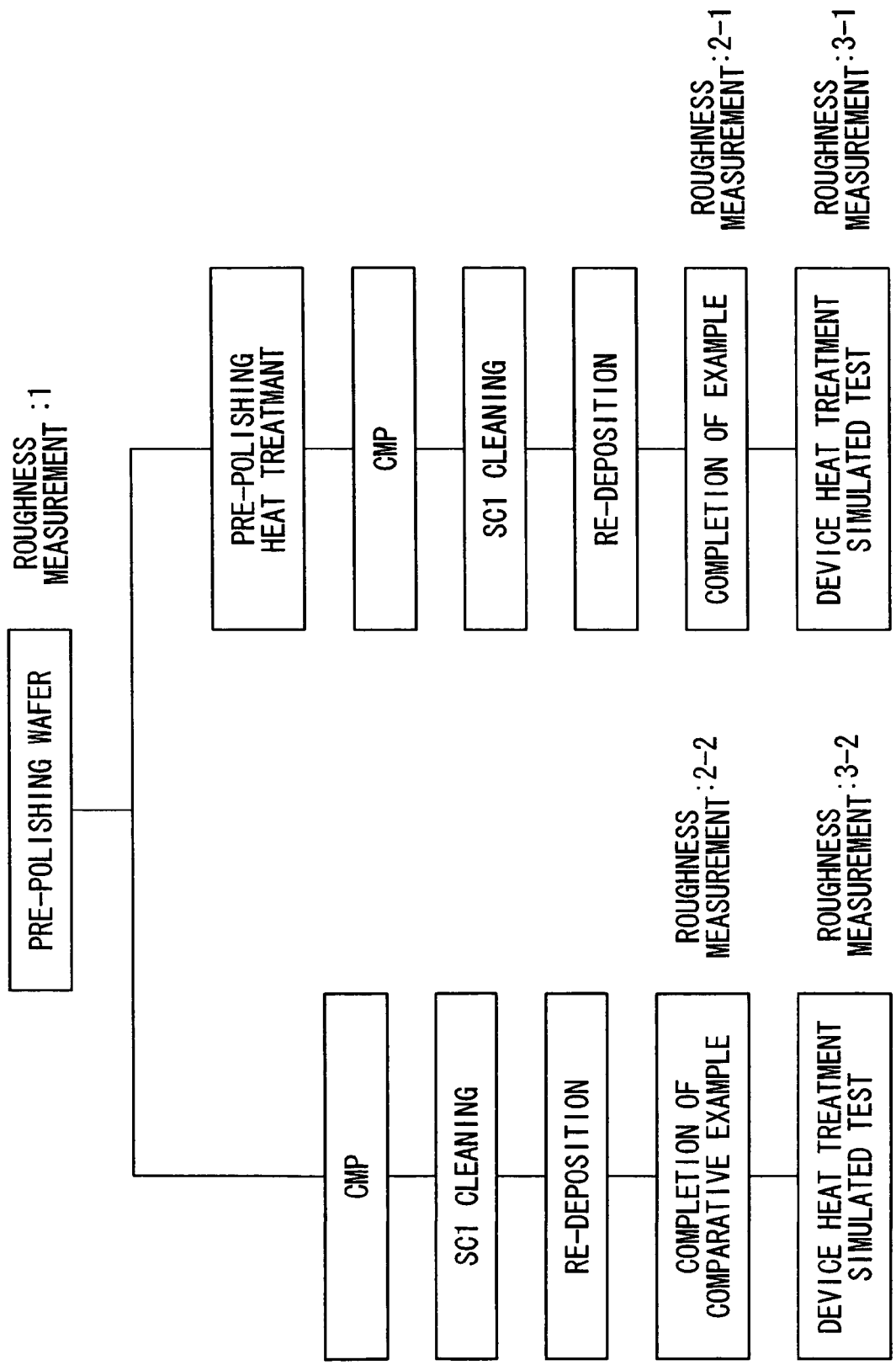

PRODUCTION METHOD FOR SEMICONDUCTOR SUBSTRATE AND PRODUCTION METHOD FOR FIELD EFFECT TRANSISTOR AND SEMICONDUCTOR SUBSTRATE AND FIELD EFFECT TRANSISTOR

TECHNICAL FIELD

The present invention relates to a production method of a semiconductor substrate used in high-speed MOSFET and other devices, a field effect transistor production method, a semiconductor substrate and a field effect transistor.

BACKGROUND ART

High-speed MOSFET, MODFET and HEMT have been proposed in recent years in which an epitaxially grown strained Si layer interposed with an SiGe (silicon-germanium) layer on an Si (silicon) substrate is used for the channel region. In this strained Si-FET, tensile strain occurs in the Si layer due to the SiGe having a larger lattice constant than the Si, and as a result, the band structure of the Si changes, degeneration is removed and carrier mobility increases. Thus, as a result of using this strained Si layer as a channel region, speed can be increased to about 1.3 to 8 times faster than ordinary speeds. In addition, since ordinary Si substrates manufactured by the CZ method can be used for the substrates, high-speed CMOS can be realized with a conventional CMOS process.

However, although epitaxial growth of a high-quality SiGe layer on an Si substrate is required for epitaxial growth of the aforementioned strained Si layer that is desired to be used as the channel region of an FET, due to the difference in the lattice constants between Si and SiGe, there were problems with crystallinity due to dislocation and so forth. Consequently, the following types of proposals have been made in the prior art.

Examples of methods that have been proposed include a method that uses a buffer layer in which the Ge composite ratio of SiGe is changed at constant, gradual increments, a method that uses a buffer layer in which the Ge (germanium) composite ratio is changed in steps, a method that uses a buffer layer in which the Ge composite ratio is changed in the form of a super lattice, and a method that uses a buffer layer in which the Ge composite ratio is changed at a constant increment using an Si off-cut substrate (in, for example, U.S. Pat. No. 5,442,205, U.S. Pat. No. 5,221,413, PCT WO98/00857 and Japanese Unexamined Patent Application, First Publication No. 6-252046).

However, the aforementioned examples of the prior art still had the problems described below.

Namely, since the aforementioned examples of the prior art still exhibits a high penetrating dislocation density on the wafer surface, there is still a need to decrease penetrating dislocation density in order to prevent transistor operation defects. In addition, although various types of heat treatment have been deployed in the process of producing a device on an SiGe layer or Si layer and so forth deposited thereon, there was the problem of the occurrence of worsening of surface or interface roughness of the SiGe layer and Si layer during the heat treatment.

DISCLOSURE OF THE INVENTION

In consideration of the aforementioned problems, an object of the present invention is to provide a semiconductor substrate production method, field effect transistor production method, semiconductor substrate and field effect transistor which, together with having low penetrating dislocation density and low surface roughness, are able to prevent worsening of surface and interface roughness during heat treatment of a device production process and so forth.

The present invention employs the following constitution to solve the aforementioned problems. Namely, the semiconductor substrate production method of the present invention is a production method of a semiconductor substrate in which an SiGe layer is formed on an Si substrate, and is comprised of a heat treatment step in which heat treatment is performed either during or after the formation of the SiGe layer by epitaxial growth, at a temperature that exceeds the temperature of the epitaxial growth, and a polishing step in which irregularities in the surface formed during the heat treatment are removed by polishing following formation of the SiGe layer.

In addition, the semiconductor substrate of the present invention is a semiconductor substrate in which an SiGe layer is formed on an Si substrate, and is produced according to the aforementioned semiconductor substrate production method of the present invention.

In this semiconductor substrate production method and semiconductor substrate, since heat treatment is performed during or after the formation of the SiGe layer by epitaxial growth at temperature that exceeds the temperature of the epitaxial growth, and irregularities in the surface formed during heat treatment are removed by polishing following formation of the SiGe layer, worsening of surface roughness caused by lattice relaxation and dislocation movement is made to occur in advance by subjecting the substrate to a preliminary heat history, and irregularities caused by worsening of surface roughness are removed resulting in a flat surface. Thus, even if this substrate is subjected to heat treatment in a device production process and so forth, recurrence of worsening of surface and interface roughness can be prevented.

The semiconductor substrate production method of the present invention preferably forms an incremental composition region in which the Ge composite ratio gradually increases towards the surface in at least a portion of the SiGe layer. Namely, in this semiconductor substrate production method, by forming an incremental composition region in which the Ge composite ratio gradually increases towards the surface in at least a portion of the SiGe layer, since the Ge composite ratio gradually increases in the incremental composition region, dislocation density can be lowered particularly on the surface side in the SiGe layer.

In addition, the semiconductor substrate production method of the present invention also comprises epitaxial growth of a strained Si layer either directly on the SiGe layer or with another SiGe layer in between.

In addition, the semiconductor substrate of the present invention is a semiconductor substrate in which a strained Si layer is formed on an Si substrate with an SiGe layer in between, and is produced according to the aforementioned semiconductor substrate production method of the present invention.

In this semiconductor substrate production method and semiconductor substrate, since a strained Si layer is epitaxially grown on an SiGe layer either directly or with another SiGe layer in between following the polishing step, an Si layer is deposited on an SiGe layer having a satisfactory surface state, and a high-quality strained Si layer can be obtained.

The field effect transistor production method of the present invention is a field effect transistor production method in which a channel region is formed in a strained Si layer epitaxially grown on an SiGe layer, and comprises the formation of the channel region in the strained Si layer of a semiconductor substrate produced according to the aforementioned semiconductor substrate production method having a strained Si layer of the present invention.

In addition, the field effect transistor of the present invention is a field effect transistor in which a channel region is formed in a strained Si layer epitaxially grown on an SiGe layer, and is produced according to the aforementioned field effect transistor production method of the present invention.

In this field effect transistor production method and field effect transistor of the present invention, since the channel region is formed in the strained Si layer of the aforementioned semiconductor substrate of the present invention or a semiconductor substrate produced according to the aforementioned semiconductor substrate production method of the present invention, a high-quality strained Si layer is obtained in an SiGe layer having a satisfactory surface state even if subjected to heat treatment during device production, thereby allowing the obtaining of a high-performance field effect transistor at high yield.

BRIEF DESCRIPTION OF THE DRAWINGS

FIG. 7 is a drawing showing a production flow chart in an example and comparative example relating to the present invention.

BEST MODE FOR CARRYING OUT THE INVENTION

Figure 1:
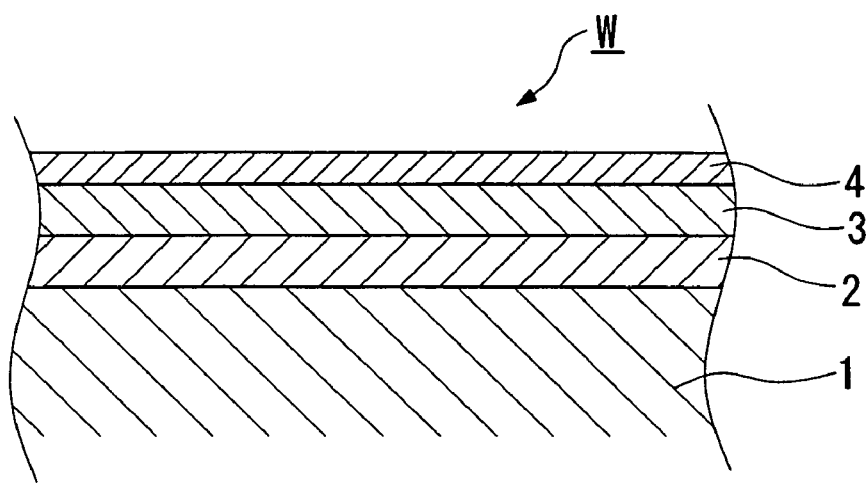
FIG. 1 is a cross-sectional view showing a semiconductor substrate provided with a strained Si layer in a first embodiment of the present invention.
Figure 2:
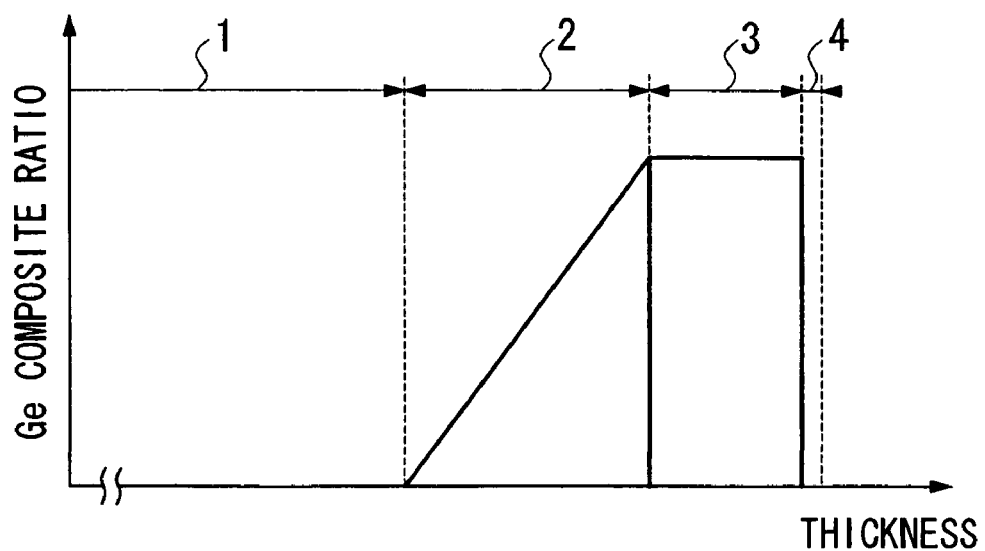
FIG. 2 is a graph showing the Ge composite ratio versus film thickness of a semiconductor substrate provided with a strained Si layer in the first embodiment of the present invention.

The following provides an explanation of a first embodiment of the present invention with reference to FIGS. 1 through 3.

FIG. 1 is a drawing showing the cross-sectional structure of a semiconductor wafer (semiconductor substrate) W provided with a strained Si layer of the present invention. The following provides an explanation of the structure of this semiconductor wafer W along with its production process. First, as shown in FIGS. 1 and 2, a first SiGe layer 2, in the form of an incremental composition layer (incremental composition region) in which Ge composite ratio x gradually increases at an increment from 0 to 0.3 in the direction of deposition (towards the surface), is epitaxially grown by vacuum CVD on an Si substrate 1. Furthermore, the aforementioned deposition by vacuum CVD uses $H_2$ for the carrier gas and $SiH_4$ and $GeH_4$ for the source gas.

Next, a second SiGe layer 3, in the form of a constant composition and buffer, is epitaxially grown at the final Ge composite ratio (0.3) of the first SiGe layer 2 in said first SiGe layer 2. These first SiGe layer 2 and second SiGe layer 3 function as an SiGe buffer layer for depositing a strained Si layer.

Figure 3A:
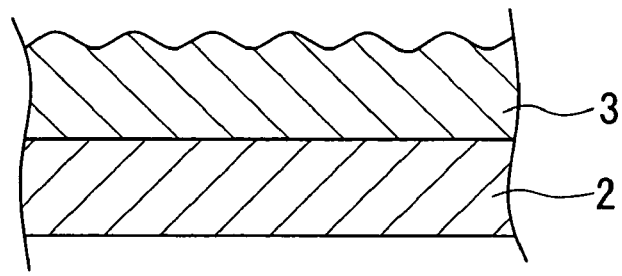
FIGS. 3A, 3B and 3C are cross-sectional views showing the steps of heat treatment, polishing and strained Si layer formation in the order they are performed in the first embodiment of the present invention.

As shown in FIG. 3A, heat treatment is performed either during or after formation of these first SiGe layer 2 and second SiGe layer 3 to cause worsening of surface roughness to occur on the SiGe layer in advance. The conditions of this heat treatment are set to a temperature that exceeds the temperature of epitaxial growth of the SiGe layers such as 800–1100° C., and to a heat treatment time of 1–200 minutes. Furthermore, in the present embodiment, the supply of source gas is temporarily interrupted during deposition of the second SiGe layer 3, and then annealed after raising the temperature to 1000° C. while still in this state. Following this annealing treatment, the temperature is lowered to the deposition temperature of the second SiGe layer 3, supply of the source gas is resumed and the remaining deposition is performed.

Figure 3B:
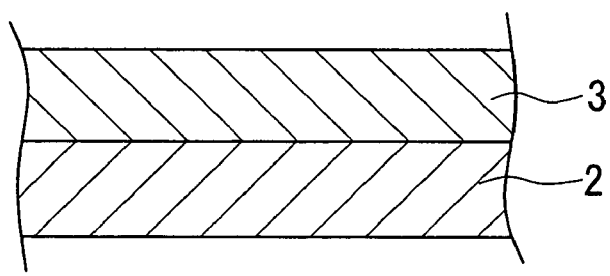

Next, as shown in FIG. 3B, the surface of the second SiGe layer 3, in which irregularities have formed in the surface by worsening of surface roughness caused by heat treatment, is polished by chemical mechanical polishing (CMP) and so forth to flatten the surface and remove the irregularities that formed due to worsening of surface roughness.

Furthermore, the film thicknesses of the aforementioned first SiGe layer 2 and second SiGe layer 3 are set to 1.5 μm and 0.75 μm, respectively.

Figure 3C:
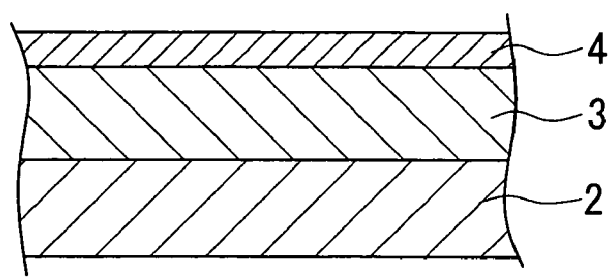

Moreover, as shown in FIG. 3C, a strained Si layer 4 is then formed by epitaxially growing an Si layer on the polished second SiGe layer 3 to produce a semiconductor wafer W.

In the present embodiment, heat treatment is performed at a temperature that exceeds the temperature of the epitaxial growth either during or after the formation of the second SiGe layer 3 by said epitaxial growth, and irregularities in the surface formed during the heat treatment are removed by polishing following the formation of the second SiGe layer 3. Since worsening of surface roughness caused by lattice relaxation and dislocation movement is made to occur in advance by subjecting the substrate to a preliminary heat history, the recurrence of worsening of surface and interface roughness can be prevented during heat treatment in a device production process and so forth.

In addition, since first SiGe layer 2 is an incremental composition region in which the Ge composite ratio increases gradually towards the surface, dislocation density particularly on the surface side in the SiGe layer can be inhibited.

Figure 4:
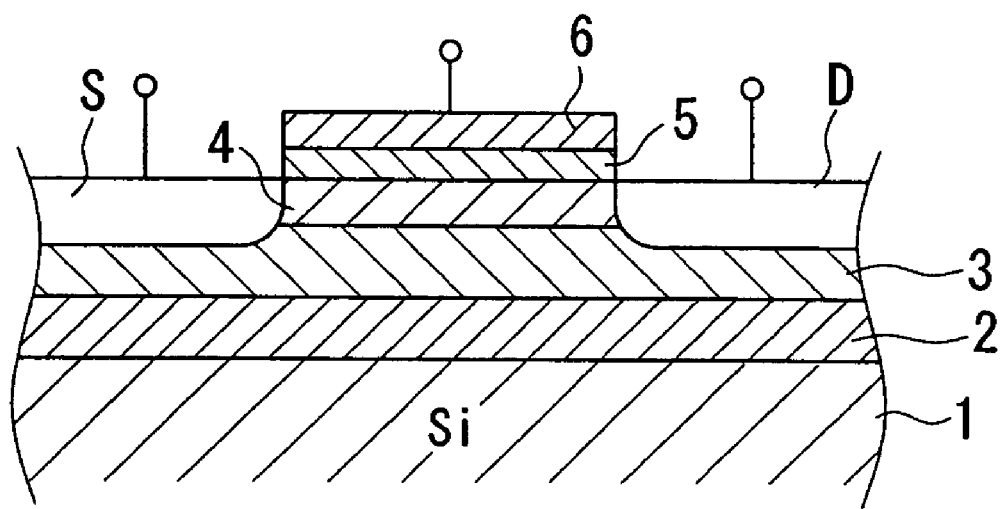
FIG. 4 is a schematic cross-sectional view showing an MOSFET in the first embodiment of the present invention.

Next, an explanation is provided of a field effect transistor (MOSFET) that uses the semiconductor substrate of the aforementioned embodiment as claimed in the present invention with reference to FIG. 4.

FIG. 4 shows the schematic structure of a field effect transistor of the present invention. In order to produce this field effect transistor, an $SiO_2$ gate oxide film 5 and a gate polysilicon film 6 are sequentially deposited on a strained Si layer 4 on the surface of a semiconductor wafer W provided with the strained Si layer produced in the aforementioned production process. A gate electrode (not shown) is then formed by patterning on gate polysilicon film 6 over the section serving as a channel region.

Next, gate oxide film 5 is also patterned to remove all sections except that beneath the gate electrode. Moreover, an n-type or p-type source region S and drain region D are then formed in a self-aligning manner on the strained Si layer 4 and the second SiGe layer 3 by ion injection using the gate electrode as a mask. Subsequently, a source electrode and drain electrode (not shown) are respectively formed on the source region S and the drain region D to produce an n-type or p-type MOSFET in which the strained Si layer 4 serves as the channel region.

In a MOSFET produced in this manner, since a channel region is formed in the strained Si layer 4 on a semiconductor wafer W provided with the strained Si layer produced with the aforementioned production method, there is no worsening of surface or interface roughness when heat treatment is applied during device production, thereby allowing the obtaining of a MOSFET offering even better operating characteristics due to a high-quality strained Si layer 4 at high yield. For example, although semiconductor wafer W is heated in order to form a thermal oxide film during formation of the aforementioned gate oxide film 5, since semiconductor wafer W is subjected to a preliminary heat history in advance, there is no worsening of surface or interface roughness on the SiGe layer or the strained Si layer during formation of the thermal oxide film.

The technical scope of the present invention is not limited to the aforementioned embodiment, but rather various modifications can be added within a range that does not deviate from the gist of the present invention.

For example, although heat treatment of the SiGe layer was performed during formation of the second SiGe layer in the aforementioned embodiment, heat treatment may also be performed during formation of the first SiGe layer or after formation of the second SiGe layer.

In addition, a semiconductor wafer additionally provided with an SiGe layer on the strained Si layer of the semiconductor substrate W provided with a strained Si layer of the aforementioned embodiment is also included in the present invention. In addition, although the strained Si layer was deposited directly on the second SiGe layer, another SiGe layer may be additionally deposited on the second SiGe layer, and the strained Si layer may be epitaxially grown with said SiGe layer in between.

In addition, although a semiconductor wafer having an SiGe layer was produced as a MOSFET substrate in the aforementioned embodiment, it may also be used for a substrate applied to other applications as well. For example, the semiconductor substrate of the present invention may also be applied to a substrate for a solar cell. Namely, a solar cell substrate may be produced by depositing an SiGe layer, in the form of an incremental composition region in which the Ge composite ratio is gradually increased so as to reach 100% Ge on the uppermost surface, on an Si substrate of each of the aforementioned embodiments, and then depositing GaAs (gallium arsenide) thereon. In this case, a high-performance solar cell substrate is obtained having a low dislocation density.

EXAMPLE

The following provides a detailed explanation of worsening of surface and interface roughness in the case of heat treatment based on the aforementioned embodiments with reference to FIGS. 5A and 5B and FIGS. 6A and 6B.

Figures 5A, 5B:
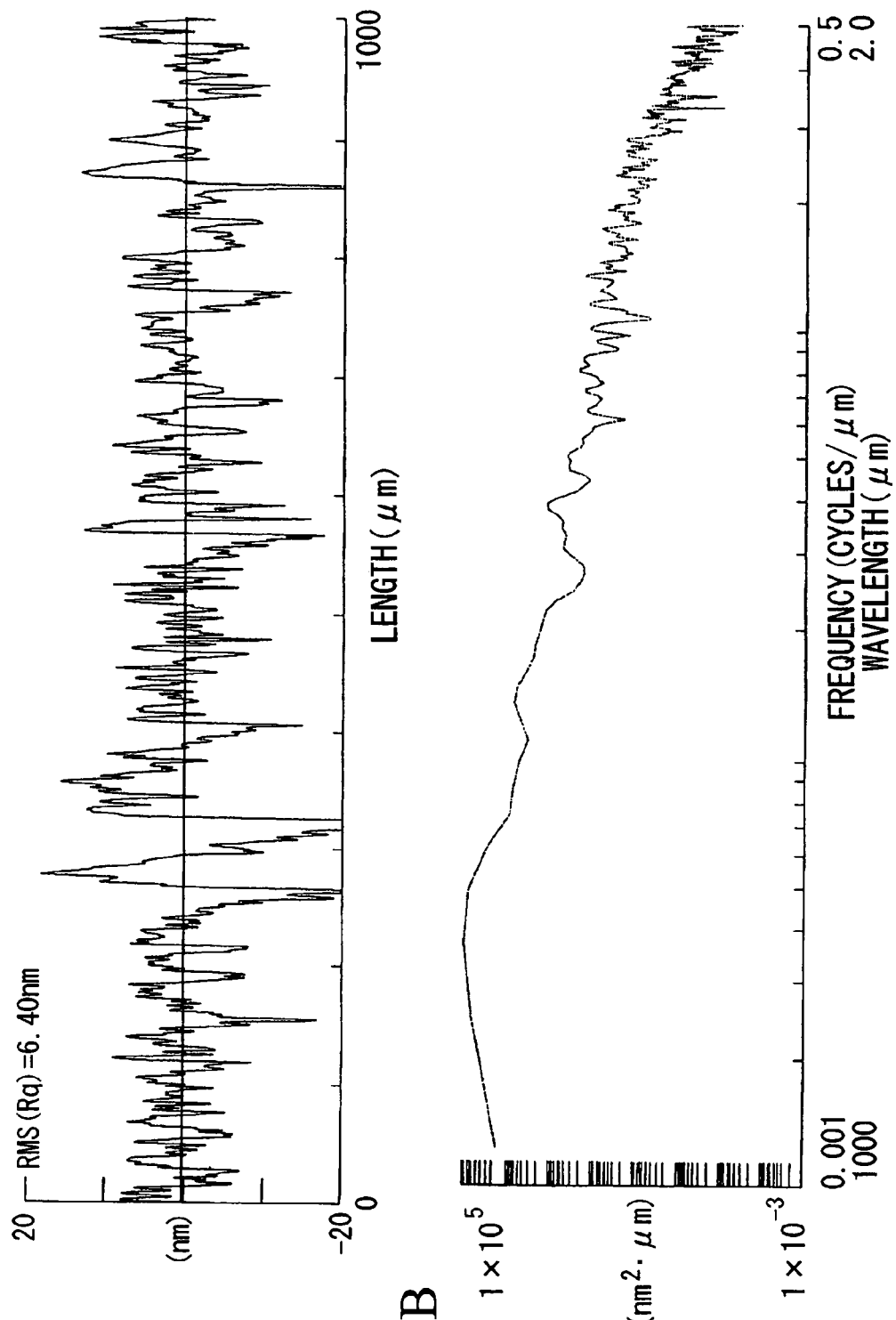
FIGS. 5A and 5B are graphs showing surface roughness and its power spectrum after heat treatment in an example of the present invention.

Graphs of surface roughness and the power spectrum of that roughness are shown in FIGS. 5A and 5B, respectively, for the case of performing heat treatment consisting of an annealing temperature of 1000° C. and annealing time of 10 minutes during deposition of the second SiGe layer 3 based on the aforementioned embodiments, and depositing the remaining second SiGe layer 3 after the heat treatment. Furthermore, surface roughness was measured using a Nomarski surface roughness measuring device. In addition, graphs of surface roughness and the power spectrum of that roughness in the case of not performing heat treatment are similarly shown in FIGS. 6A and 6B as a comparative example. In the aforementioned graphs of the power spectra of surface roughness, the wavelength of the roughness period is plotted on the horizontal axis, while the intensity for each wavelength component of roughness is plotted on the vertical axis.

Figure 6A:
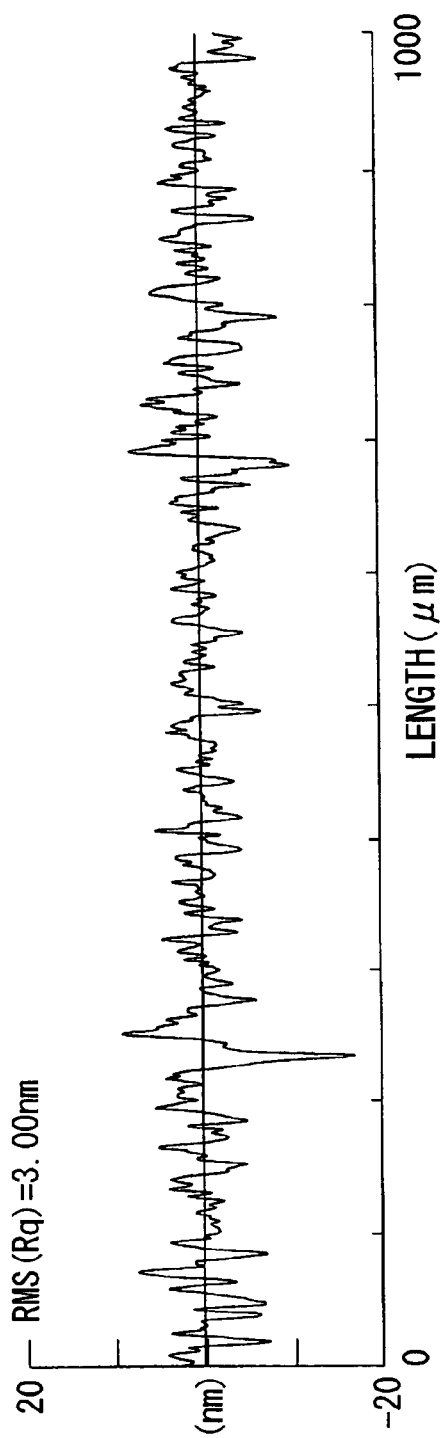
FIGS. 6A and 6B are graphs showing surface roughness and its power spectrum after heat treatment in a comparative example relating to the present invention.
Figure 6B:
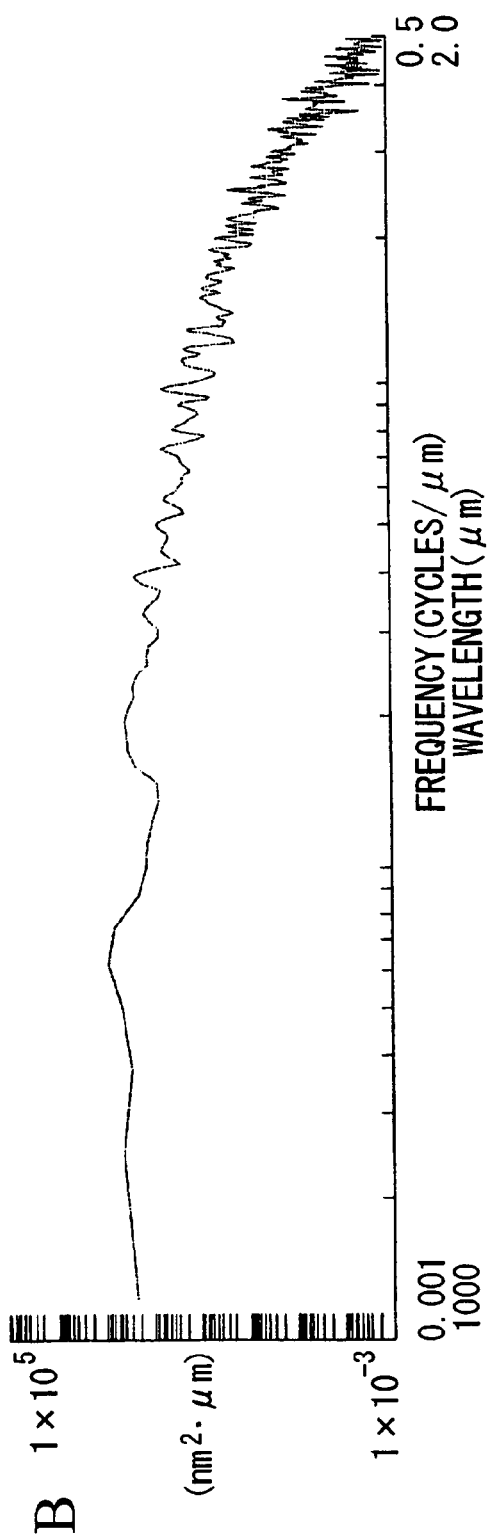

As can be understood from FIGS. 5A and 6A, in the example of the present invention, surface roughness increased from a root mean square (RMS) value of 3.00 nm to 6.40 nm as compared with the comparative example. In addition, as shown in FIGS. 5B and 6B, the power spectrum components of several hundred μm or more increased, indicating that irregularities are occurring on the surface at a period having a large wavelength. Namely, this means that the SiGe layer was subjected to sufficient heat history due to the aforementioned annealing treatment. Thus, the occurrence of worsening of surface and interface roughness during heat treatment in a device production process can be prevented by removing irregularities in the surface of the second SiGe layer in the aforementioned polishing step. In actuality, surface roughness exhibited an RMS value of 0.60 nm when irregularities in the second SiGe layer surface were removed in the aforementioned polishing step. When this sample following polishing was subjected to heat treatment consisting of an annealing temperature of 1000° C. and annealing time of 10 minutes, there was no worsening of surface roughness.

Next, separate from the aforementioned example, an example subjected to annealing treatment and a comparative example not subjected to annealing treatment were prepared, and both were measured with an atomic force microscope (AFM) (to determine roughness in an actual space).

For both the example and comparative example, deposition was carried out with a single-wafer vacuum epitaxial growth system using an Si substrate 1 having a diameter of 200 mm by mixing $SiH_4$ and $GeH_4$ into carrier hydrogen and depositing at a pressure of 5000–15000 Pa and temperature of 680–850° C. The production flow chart of these example and comparative example is shown in FIG. 7.

Figure 8:
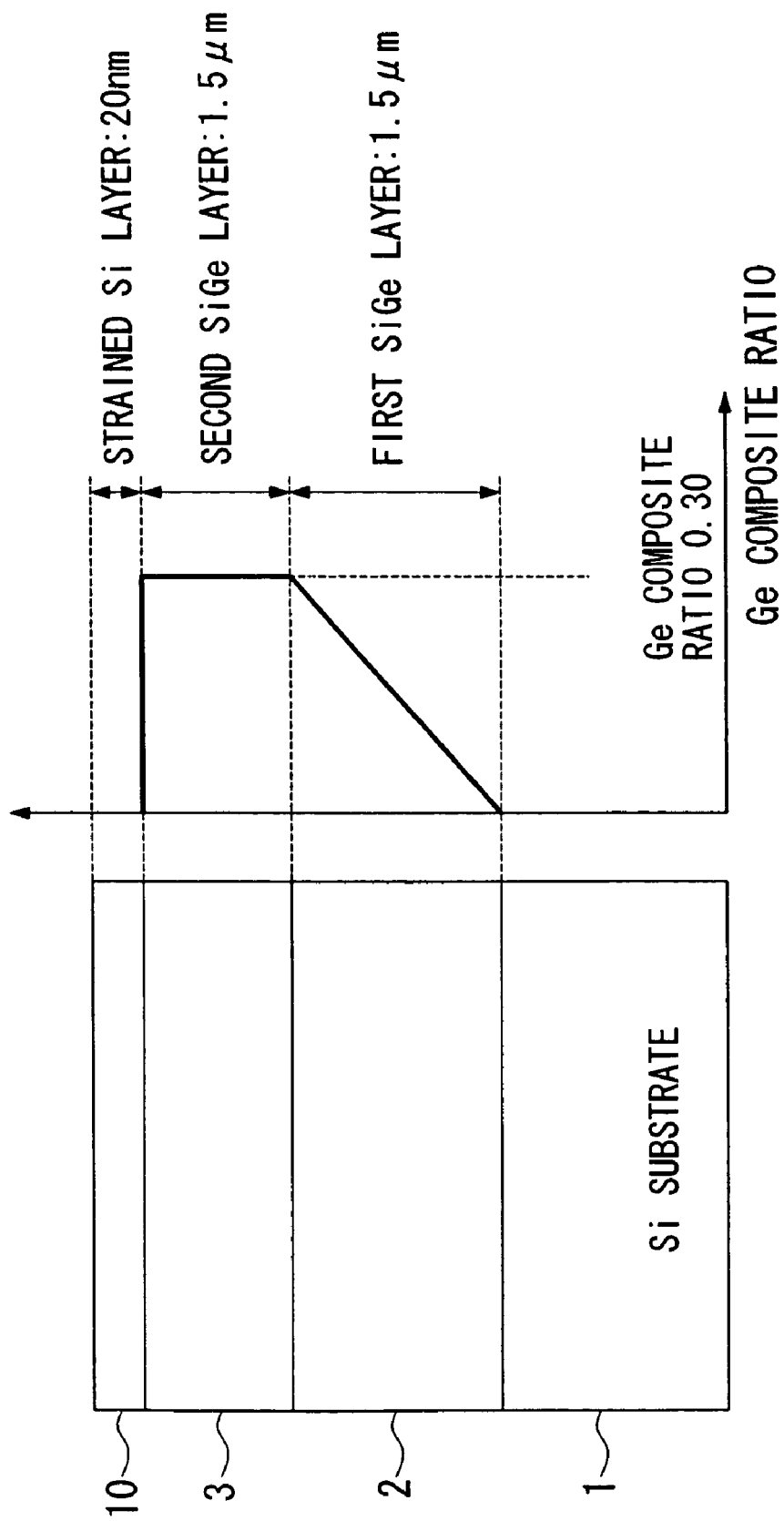
FIG. 8 is an explanatory drawing showing wafer layer structure and Ge composite ratio before polishing in an example and comparative example relating to the present invention.

First, as shown in FIG. 8, a first SiGe layer 2, a second SiGe layer 3 and a strained Si layer 10 were deposited at 1.5 μm, 1.5 μm and 20 nm, respectively, prior to annealing treatment and polishing treatment. Furthermore, the Ge composite ratio of the second SiGe layer was made to be 0.30.

Next, pre-polishing annealing treatment was performed for 30 minutes at 1100° C. in the presence of flowing nitrogen gas with a horizontal heat treatment oven.

In addition, post-annealing polishing treatment (CMP treatment) was performed using a polishing amount of 0.5 μm, and ordinary SC1 cleaning was performed following this polishing treatment.

Next, after SC1 cleaning, a second SiGe layer 3 was re-deposited at 0.2 μm under the same conditions as the initial deposition, and a strained Si layer 4 was deposited at 20 nm.

Finally, heat treatment was additionally performed for 30 minutes at 1100° C. in the presence of flowing nitrogen gas using a horizontal heat treatment oven in order to compare the heat resistance of the present example and comparative example in the form of a simulated test of heat treatment during a device production process.

Measurement by AFM and measurement using a surface roughness gauge were performed for the present example and comparative example produced in the manner described above. Furthermore, measurements were made before polishing and before and after the device heat treatment simulated test, respectively, for the sake of comparison.

Furthermore, AFM measurement was performed using a scanning region measuring 20 μm×20 μm, while measurement using the surface roughness gauge was performed using a scanning line length of 1 mm, cutoff length of 0.1 mm and in measurement steps of 0.2 μm.

The results of these measurements are as shown below.

<Roughness Measurement: 1> (Present example and comparative example: wafer before polishing)
RMS: 4.84 nm
P-V value: 43.97 nm <Roughness Measurement: 2-1> (Present example: wafer after polishing and immediately after re-deposition)
RMS: 0.68 nm
P-V value: 6.69 nm <Roughness Measurement: 2-2> (Comparative example: wafer after polishing and immediately after re-deposition)
RMS: 1.91 nm
P-V value: 19.02 nm <Roughness Measurement: 3-1> (Present example: wafer after heat treatment simulated test)
RMS: 0.95 nm
P-V value: 10.36 nm <Roughness Measurement: 3-2> (Comparative example: wafer after heat treatment simulated test)
RMS: 2.27 nm
P-V value: 19.57 nm On the basis of the above results, the present example exhibited an extremely small change in RMS following the heat treatment simulated test as compared with the comparative example, thereby demonstrating a satisfactory surface state.

Figure 9:
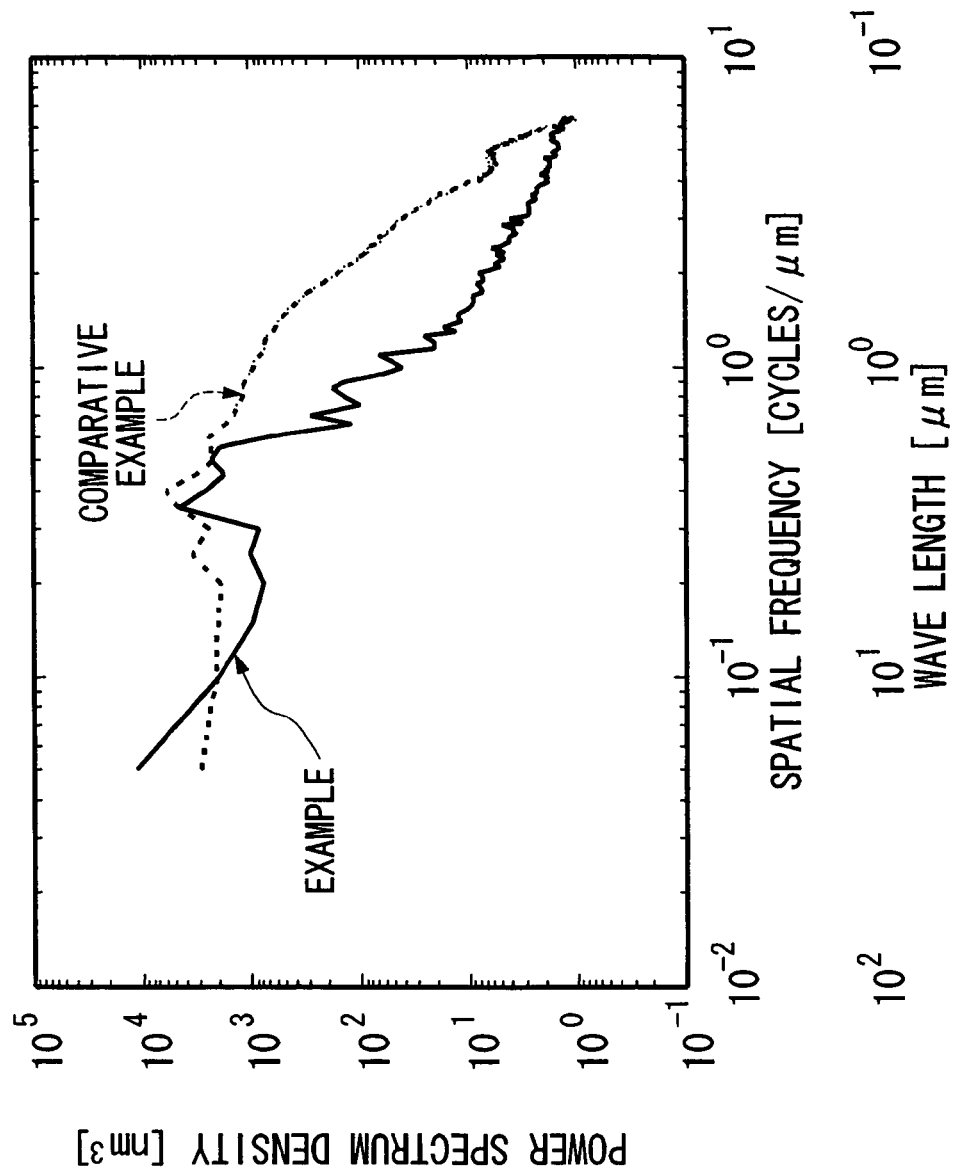
FIG. 9 is a graph showing the power spectrum after simulated heat treatment in an example and comparative example relating to the present invention.

In addition, the power spectra resulting from Fourier transformation of the results of AFM measurement are shown in FIG. 9. It can be understood from these spectra that in the case of the present example, there is considerable improvement in the power spectrum of $5 \times 10^{-1}$ cycles/μm in terms of spatial frequency and 2 μm or less in terms of wavelength as compared with the comparative example. Namely, a considerable improvement in worsening of micro-roughness due to heat history is indicated for the present example as compared with the comparative example. In the case of strained Si, micro-roughness is known to have a strong effect on deterioration of hole mobility, thereby demonstrating that the present invention can result in a considerable improvement in the production of p-type transistors (which are essential for the production of CMOS) using strained Si wafers.

INDUSTRIAL APPLICABILITY

According to the semiconductor substrate and semiconductor substrate production method of the present invention, since heat treatment is performed at a temperature that exceeds the temperature of epitaxial growth either during or after formation of an SiGe layer by said epitaxial growth, and surface irregularities formed due to heat treatment are removed by polishing after forming the SiGe layer, even if heat treatment is performed in a device production process and so forth on this substrate from which surface irregularities resulting from preliminary heat history have been removed by polishing, recurrence of worsening of surface or interface roughness can be prevented.

In addition, according to the semiconductor substrate provided with a strained Si layer and its production method of the present invention, since a strained Si layer is arranged on the SiGe layer either directly or with another SiGe layer in between, a substrate can be obtained that is suitable as a substrate for an integrated circuit that uses, for example, a MOSFET having a strained Si layer for a channel region.

Moreover, according to the field effect transistor and its production method of the present invention, since the transistors have a channel region in the strained Si layer of the aforementioned semiconductor substrate of the present invention or semiconductor substrate produced according to the aforementioned semiconductor substrate production method of the present invention, even if the transistors are subjected to heat treatment during device production, a high-quality strained Si layer is provided on an SiGe layer having a favorable surface state, and a high-performance MOSFET can be obtained at high yield.

Thus, the present invention is industrially useful.

The invention claimed is:

1. A semiconductor substrate production method in which an SiGe layer is formed on an Si substrate, comprising:
    performing a heat treatment in which the heat treatment is executed either during or after the formation of the SiGe layer by epitaxial growth at a temperature that exceeds the temperature of the epitaxial growth, and
    polishing the SiGe layer so that irregularities on a surface of the SiGe layer formed during the heat treatment are removed by polishing following formation of the SiGe layer.

2. A semiconductor substrate production method according to claim 1 wherein, an incremental composition region in which the Ge composite ratio gradually increases towards the surface is formed in at least a portion of the SiGe layer.

3. A semiconductor substrate production method according to claim 1 or claim 2 wherein, a strained Si layer is epitaxially grown on the SiGe layer either directly or with another SiGe layer in between after the polishing.

4. A field effect transistor production method in which a channel region is formed in a strained Si layer epitaxially grown on an SiGe layer, comprising:
    forming the channel region in the strained Si layer of a semiconductor substrate produced according to a semiconductor substrate production method according to claim 3.

5. A semiconductor substrate in which a strained Si layer is formed on an Si substrate with an SiGe layer in between produced according to a semiconductor substrate production method according to claim 3.

6. A field effect transistor in which a channel region is formed in a strained Si layer epitaxially grown on an SiGe layer that is produced according to a field effect transistor production method according to claim 4.

7. A semiconductor substrate in which an SiGe layer is formed on an Si substrate produced according to a semiconductor substrate production method according to claim 1 or claim 2.

* * * * *